United States Patent [19]

Pollock et al.

[11] Patent Number: 4,915,745
[45] Date of Patent: Apr. 10, 1990

[54] THIN FILM SOLAR CELL AND METHOD OF MAKING

[75] Inventors: Gary A. Pollock, Canoga Park; Kim W. Mitchell, Granada Hills; James H. Ermer, Burbank, all of Calif.

[73] Assignee: Atlantic Richfield Company, Los Angeles, Calif.

[21] Appl. No.: 247,802

[22] Filed: Sep. 22, 1988

[51] Int. Cl.[4] .................... H01L 31/06; H01L 31/18
[52] U.S. Cl. ................................ 136/265; 136/260; 136/264; 437/5; 427/76; 357/30
[58] Field of Search ............ 136/256, 260, 264, 265; 357/30 E, 30 J; 437/5, 232; 427/74, 76

[56] References Cited

U.S. PATENT DOCUMENTS

| | | | |
|---|---|---|---|
| 4,335,266 | 6/1982 | Mickelsen et al. | 136/20 |
| 4,465,575 | 8/1984 | Love et al. | 204/192.26 |
| 4,581,108 | 4/1986 | Kapur et al. | 204/37.1 |
| 4,611,091 | 9/1986 | Choudary et al. | 136/260 |
| 4,703,131 | 10/1987 | Dursch | 136/258 |
| 4,798,660 | 1/1989 | Ermer et al. | 204/192.17 |
| 4,818,357 | 4/1989 | Case et al. | 204/192.25 |

OTHER PUBLICATIONS

L. L. Kazmerski et al, *J. Vac. Sci. Technol.*, vol. A2 (27, Apr./Jun. 1984, pp. 292–295.
N. Romeo et al., *Conf. Record, 18th IEEE Photovoltaic Specialists Conference* (1985), pp. 1388–1392.
V. J. Kapur et al, *Conference Record, 18th IEEE Photovoltaic Specialists Conference* (1985), pp. 1429–1432.
V. J. Kapur et al, *Solar Cells*, vol. 21, pp. 65–72 (1987).
SERI Final Report, Contract No. Xl-5-05036-1, Oct. 1987.

Primary Examiner—Aaron Weisstuch
Attorney, Agent, or Firm—Nilsson, Robbins, Dalgarn, Berliner, Carson & Wurst

[57] ABSTRACT

A structure for, and method of making, thin films of Group I-III-VI compound semiconductors such as copper indium diselenide for use in heterojunction photovoltaic devices fabricated on metal substrates. An interfacial film containing gallium is first deposited upon the substrate. Thereafter, copper and indium films are deposited and the resulting stacked film is heated in the presence of a source of selenium to form copper indium diselenide semiconductor material with improved adhesion to the substrate and improved performance.

24 Claims, 1 Drawing Sheet

THIN FILM SOLAR CELL AND METHOD OF MAKING

BACKGROUND OF THE INVENTION

The present invention relates to thin film heterojunction photovoltaic devices formed from Group I-III-VI compound semiconductors, such as copper indium diselenide, deposited upon a metal back contact and more particularly to a structure of, a method of making, such devices wherein gallium is incorporated at the interface of the back contact and the compound semiconductor.

The background of copper indium diselenide (CIS) cadmium sulfide solar cells is discussed in considerable detail in U.S. Pat. No. 4,335,266 issued to Mickelsen, et al on June 15, 1982, which patent is hereby incorporated by reference for all purposes. As generally discussed in this reference, this type of device is considered by many to be a viable solar cell. Numerous improvements in efficiency of such solar cells are well documented by publications and patents covering such improvements.

U.S. Pat. No. 4,611,091, issued to Choudary, et al on Sept. 9, 1986, covers one such improvement. This patent is hereby incorporated by reference for its teaching of a structure in which a majority of the cadmium sulfide layer used by Mickelsen is replaced by a substantially conducting wide bandgap n-type semiconductor material such as zinc oxide.

U.S. Pat. No. 4,581,108, issued to Kapur, et al on Apr. 8, 1986, is hereby incorporated by reference for its teachings concerning an improved method for forming CIS for use in Mickelsen type solar cells. In this patent, layers of copper and indium are sequentially deposited on a substrate by electrodeposition. This process provides very close control of the total quantities of these two elements and allows precise control of the ratio or relative amounts of the two elements. As taught by this patent and generally understood in the art, close control of this ratio is considered critical to fabrication of CIS films having good electronic properties. This patent also describes a process known as selenization wherein the electrodeposited copper and indium films are heated at 400 degrees C in the presence of $H_2Se$ gas to complete formation of CIS material.

Many researchers believe that the conversion efficiency of CIS type solar cells can be increased to over fifteen percent if the device band-gap values can be increased to about 1.5eV. For example, the paper entitled "Low Cost Thin Film Chalcopyrite Solar Cells" by Kapur, et al, Conference Record, 18th IEEE Photovoltaic Specialists Conference (1985), pp 1429-1432 suggests that this may be achieved by fabricating single phase $CuIn_{1-x}Ga_xSe_2$ films. A related paper, entitled "Low Cost Methods for the Production of Semiconductor Films for $CuInSe_2CdS$ Solar Cells" by Kapur, et al, Solar Cells, Vol 21, pp 65-72(1987) reports making of such devices by sequential electroplating of copper, indium and gallium to achieve a ratio of copper to indium plus gallium of 0.95 to 0.98. However, no improvement in performance of finished devices was reported.

An adhesion problem has been recognized at the interface between the typical molybdenum substrate and the CIS film. See for example the above referenced 1985 IEEE Kapur, et al paper. See also the final report entitled "High Efficiency Copper Ternary Thin Film Solar Cells" by Kapur, et al, October 19, 1987 reporting on work performed under Contract No. XL-5-05036-1 for the Solar Energy Research Institute. That paper reports that there appears to be a lack of mechanical adhesion at this interface. The lack of adhesion can cause wrinkling and shunting of the CIS film and in some cases the film spontaneously peels from the substrate. The SERI final report discusses an attempt to plate a 200 angstrom thick layer of indium or lead on the molybdenum surface before plating of copper. However, the report indicates that only "some of the devices made with these structures showed response, and the highest $V_{oc}$ measured in one device was 330 mV" considerably lower than is normally expected from a CIS type solar cell.

SUMMARY OF THE INVENTION

Accordingly, an object of the present invention is to provide an improved structure for Group I-III-VI semiconducting films such as copper indium diselenide and for photovoltaic devices including such films.

Another object of the present invention is to provide an improved method for making a Group I-III-VI film, and more particularly, for improving adhesion between such films and a metal substrate.

According to the present invention, an improved photovoltaic device includes a metal back contact, preferably molybdenum, an interfacial film containing gallium and a Group I-III-VI semiconductive film on the interfacial film.

In one embodiment, an interfacial film containing gallium is deposited on the back contact by deposition of a copper/gallium alloy containing at least one percent gallium and sufficient copper to form a CIS film. The semiconducting film is then completed by deposition of indium onto the copper gallium alloy film and heat treatment of the resulting stacked film in the presence of a source of selenium at a temperature and for a time selected to cause interdiffusion of copper, indium and selenium to form a CIS semiconducting film. Gallium remains in that portion of the film immediately adjacent the molybdenum substrate and appears to improve adhesion between the molybdenum and the CIS semiconducting film.

In another embodiment, an interfacial film of copper/gallium alloy is deposited on the metal back contact to a thickness less than that required to provide sufficient copper to form a CIS film. The CIS film is then completed by deposition of a pure copper film and indium and heat treatment of the resulting stacked film in the presence of a source of selenium at a temperature and for a time selected to cause interdiffusion of copper, indium and selenium to form a CIS semiconducting film.

In yet another embodiment, an interfacial film of gallium selenide is deposited on the metal back contact. A CIS film is then formed on the interfacial film by deposition of a pure copper film and a pure indium film and heat treatment of the resulting stacked films in the presence of a source of selenium at a temperature and for a time selected to cause interdiffusion of copper, indium and selenium to form a CIS semiconducting film.

DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
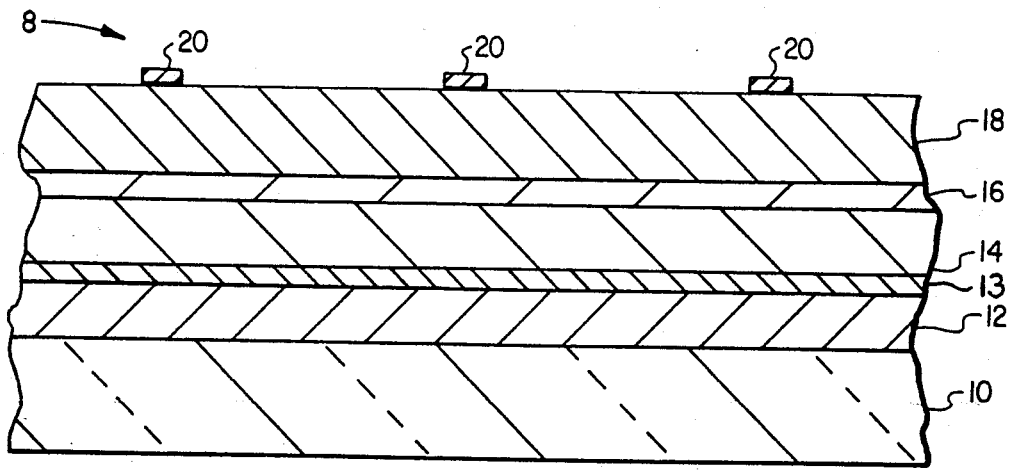
FIG. 1 is a cross sectional view, not to scale, of a portion of thin film solar cell according to the present invention.

With reference to FIG. 1, there is illustrated a portion of a photovoltaic cell 8 corresponding generally to that described in the above referenced U.S. Pat. No. 4,611,091. This is the preferred structure of the present invention and is the structure used in the example devices described below. Cell 8 is structurally supported on a glass substrate 10 which is about one to four millimeters thick. A back electrical contact comprises a metal layer 12 deposited on substrate 10. Layer 12 in a preferred embodiment is molybdenum having a thickness of about 0.2 to two microns. In the preferred embodiments film 12 includes a very thin film, 100 to 500 angstroms, of chromium first deposited on glass substrate 10 to improve adhesion of the molybdenum to the glass. Deposited upon layer 12 is an interfacial film or layer 13 containing gallium. The structures of and methods of making layer 13 are described in more detail below. The first active region of the device 8 comprises a semiconducting film 14, which in a preferred embodiment is p-type CIS having a thickness of about one to three microns. The manufacture of layer 14 is also described in more detail below. A thin layer 16 of n-type semiconductor material comprising cadmium sulfide is positioned on layer 14. In the preferred embodiments, layer 16 has a thickness of from about 250 to about 500 angstroms. A layer 8 of conducting wide bandgap n-type semiconductor material is positioned on layer 16. In the preferred embodiment, layer 18 is formed primarily of zinc oxide and has a thickness of from about 1.5 to 3.5 microns. The device 8 is completed by a series of front face contacts 20 in the form of narrow metal strips which may be, for example, aluminum deposited by sputtering, evaporation or plating. In some device designs, contacts 20 are omitted.

Figure 2:
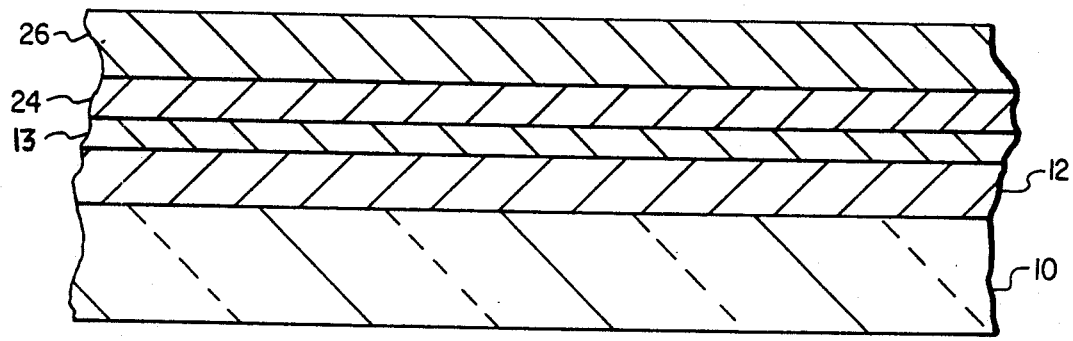
FIG. 2 is a cross sectional view of a portion of substrate at an intermediate stage of manufacture.

With reference to FIG. 2 there is illustrated the device 8 of FIG. 1 at an intermediate stage of manufacture. At this stage, the substrate 10 has deposited thereon the back contact film 12 and three additional layers of material. In the preferred embodiment, these films include a film containing gallium 13, a film of copper 24, and a film of indium 26. In this preferred form, the copper film 24 is about 2000 angstroms thick and the indium film 26 is about 4000 angstroms thick. This nominal 2000 angstrom copper layer provides about 12.7 mg of copper per 100 cm² of substrate area which is used as the baseline or control for experimental comparisons discussed below. These thicknesses provide a copper to indium atomic ratio of about one, which is generally accepted as desirable for formation of CIS films. These preferred thicknesses result in a final CIS film thickness, after selenization, of about two microns. For other desired CIS film thicknesses, the specified initial elemental film thicknesses would be proportionally adjusted.

Figure 3:
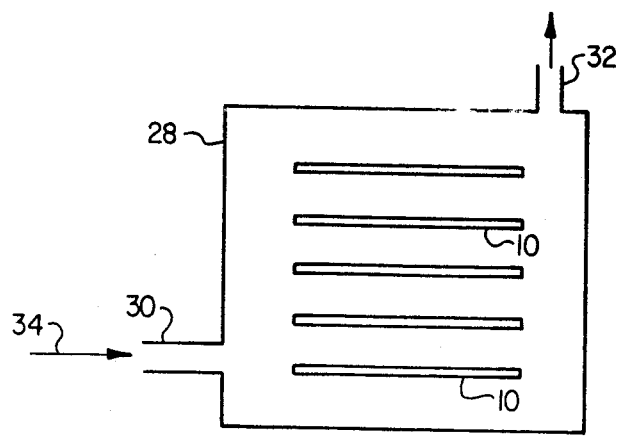
FIG. 3 is a schematic illustration of a furnace in which heating is performed according to the present invention.

With reference to FIG. 3, there is illustrated the basic furnace arrangement used in the present invention. The basic furnace 28 is simply a closed heating chamber having a gas inlet 30 and outlet 32. While, in the preferred embodiment, the furnace is operated at approximately atmospheric pressure, appropriate seals and safety mechanisms are provided to avoid accidental release of gases since some are toxic. For example, exhaust vent 32 leads to appropriate gas burners and scrubbers to remove all toxic material before venting to the atmosphere. Substrates 10 are shown positioned in the furnace where they are heated in the presence of a gas fed in through inlet 30 as indicated by the arrow 34.

Various methods are known for depositing films 13, 24, and 26 illustrated in FIG. 2. For example, various researchers have used electrodeposition and evaporation to deposit these films. However, in the preferred embodiment, we have used magnetron sputtering for most films. U.S. Pat. No. 4,465,575 issued to Love, et al on Aug. 14, 1984 is hereby incorporated by reference for its teachings of magnetron sputtering for the formation of CIS films. In a preferred embodiment, the films 13, 24, and 26 are deposited from physically distinct magnetron sputtering heads instead of being codeposited as taught by Love, et al. This process provides totally independent control of the thicknesses of the films. We also believe that the magnetron sputtering technique provides an additional advantage. We have found that magnetron sputtering of indium onto a copper film results to some extent in instantaneous alloying or mixing of the copper and indium materials. Thus, while films 26 and 24 are shown as distinct films, the preferred deposition technique actually results in a composite film of copper and indium. That is, there is not a distinct interface between the films after the film deposition process. For control purposes, the indium film can be considered deposited as a separate film since it is not actually codeposited with copper and the quantity deposited can be determined by measurement of total film thickness or by measurement of indium film thickness on a separate sample having no copper film. For purposes of the present invention, the term "composite film of copper and indium" is intended to mean either the separate copper and indium films 24 and 26 as illustrated in FIG. 2 or any form of those films including a totally alloyed combination of the films 24 and 26 which we believe results from the preferred deposition technique.

As taught by the above cited references, there is a recognized problem of adhesion between a CIS film and the molybdenum back contact typically used. The lack of adhesion can be so severe that the CIS film actually peels from the substrate spontaneously. Even when the CIS film is mechanically attached to the molybdenum film, wrinkling of the film often occurs, causing electrical shunts and reducing the power output of the device. In the present invention, the interfacial film 13 containing gallium greatly improves the adhesion between the CIS film 14 and the molybdenum film 12. In its most straightforward form, film 13 may be a very thin film of elemental gallium deposited upon molybdenum film 12. Due to its low melting point, it is inconvenient to sputter pure gallium. Gallium can be evaporated or electroplated. A gallium film of from 50 to 1500 angstroms is appropriate for the present invention. The copper and indium films 24 and 26 may then be deposited on the gallium by electrodeposition or other techniques and preferably by magnetron sputtering.

We discovered an alternate and preferred method for depositing interfacial film 13 while attempting to fabricate a single phase semiconducting film of the Class $CuIn_{1-x}Ga_xSe_2$, where x is less than Experimental devices were fabricated by magnetron sputtering of a copper gallium alloy having 17 atomic percent gallium onto a molybdenum substrate 12. Thus in this embodiment the films 13 and 24 of FIG. 2 were deposited as a single film, having a thickness of about 2500 angstroms. An indium film about 3500 angstroms thick was deposited in the same magnetron sputtering chamber but from a separate head by moving the substrate sequentially past the sputtering heads without breaking vacuum. The substrates were then selenized, that is heated in furnace 28 in the presence of a source of selenium to form a compound semiconductor film. In a preferred process, the chamber 28 was filled with gas comprising twelve percent $H_2Se$ diluted in nitrogen. The substrates were slowly heated up to about 300 degrees C. and held at this temperature for 15 to 20 minutes. Thereafter, the temperature was ramped up to about 450 degrees C, and held at that temperature for about thirty minutes. When devices were completed by application of cadmium sulfide and zinc oxide films, as illustrated in FIG. 1, a significant efficiency increase was achieved as compared to devices in which the copper film 24 contained no gallium.

Initially, it was assumed that the efficiency increase resulted from a shift of the bandgap as was expected and intended. However, upon spectral response analysis of the devices containing gallium, we found that the bandedge was about 1.0 eV, which is typical for conventional CIS material. This indicated that the gallium had not significantly interdiffused with the copper, indium and selenium and was not present in sufficient quantity in the active junction area of the finished device to change the optical bandgap. The sample films were then analyzed by Auger analysis to determine the location of the various elements. Though gallium may be present throughout the CIS film in very low concentrations below those detectable with Auger analysis, the Auger analysis detected gallium only near its initial location adjacent to the molybdenum. Copper, indium and selenium had interdiffused to form the 2 micron thick CIS film. Copper, indium and selenium were also detected in the region adjacent to the molybdenum. The analysis also found selenium in a portion of the molybdenum film adjacent to the CIS film. In addition to the efficiency increase, the devices also exhibited greatly improved adhesion, that is, no peeling or noticeable wrinkling of the CIS film occurred. We believe the improvement results from the presence of gallium compounds at the interface between the molybdenum substrate and the CIS film.

In an effort to further isolate the effectiveness of gallium at the CIS molybdenum interface, further experiments were performed.

A number of devices were fabricated according to FIG. 2 in which the copper/gallium (17 atomic percent gallium), film 13 had thicknesses less than the 2500 angstroms described immediately above. A film of pure copper was then deposited to a thickness selected to provide the baseline amount of copper, that is 12.7 mg copper per 100 $cm^2$ substrate area. The CIS films ere completed by deposition of indium and selenization as described above. Devices were completed according to FIG. 1 to test efficiencies. Devices were made using copper/gallium alloy film thicknesses of 10%, 50% and 75% of the nominal 2500 angstrom baseline and, for control, some were made with the full 2500 angstrom film thickness. These films provide quantities of gallium equivalent to pure gallium films of 46, 230, 314 and 407 angstroms respectively. The best open circuit voltage, $V_{oc}$, from the various sample tests ranged from 0.445 to 0.469 volt. Corresponding best efficiencies ranged from 10.2% to 12.3%. Good adhesion was achieved for all samples, except for one of the three with the least amount of gallium. This suggests that the equivalent of at least fifty angstroms of elemental gallium is preferred to achieve good adhesion and the other benefits of the present invention. However, no additional improvement in performance was found for equivalent gallium film thickness greater than about 200 angstroms. These experiments indicate that a gallium film of from 50 to 500 angstroms is appropriate for the present invention. While the equivalent of at least fifty angstroms of pure gallium was achieved by a reduced thickness of copper/gallium (17 atomic percent gallium) in these tests, it can also be achieved by reducing the gallium content of the copper/gallium alloy to about 1% and depositing the nominal 2500 angstrom alloy film.

Another set of experiments was performed in which the interfacial film 13 of FIG. 2 was an evaporated film of gallium selenide, $Ga_2Se_3$, having thicknesses of 100, 700 and 1300 angstroms. These thicknesses contain the same amounts of gallium as pure gallium film thicknesses of 29, 185 and 350 angstroms respectively. The 1300 angstrom thickness provides about the same amount of gallium as the baseline 2500 angstrom copper/gallium (17 atomic percent gallium) alloy film. CIS films were made by magnetron sputtering of pure copper to the baseline thickness, sputtering indium and selenizing under the conditions described above. We believe that some of the copper diffuses into the interfacial film during the selenization step. Devices were completed according to FIG. 1 to test performance. All devices made with 700 and 1300 angstrom gallium selenide films, sixteen each, had good adhesion, with best $V_{oc}$ being about 0.480 volt and best efficiency being about 13%. A majority of devices with only 100 angstroms of gallium selenide had poor adhesion and the rest had poor electrical performance. This again indicates that at least about fifty angstroms equivalent of pure gallium is preferred.

Other experimentation has illustrated additional benefits and advantages of the present invention. As indicated above and by the various Kapur, et al publication, it has generally been established that stacked copper indium films should be selenized at a temperature of about 400 degrees C. We have found that higher temperatures are preferred to increase the interdiffusion rate and form more uniform CIS material and to alter the density and nature of defects in the CIS material. However, we have also found that at temperatures above 400 degrees C, wrinkling or peeling of the CIS film occurs in a high percentage of devices without a gallium interfacial layer and yields are not acceptable. As a result, the process temperature has been established at 400 degrees C. since fairly good material can be fabricated while minimizing the peeling problem. However, by use of the present invention which improves the mechanical adhesion between the CIS film and molybdenum, the selenization temperature may be increased and, as a result, better CIS films may be fabricated. As a result of this discovery, the preferred selenization temperature has been increased to about 450 degrees C. Our tests indicate that even higher temperatures, possibly 550 degrees C., could provide even better results. The preferred selenization sequence involves heating the substrates to a temperature of 250 to 350 degrees C., preferably about 300 degrees C., and holding for a short time, for example, 10 to 30 minutes. Thereafter, the temperature is ramped to 400 to 500 degrees C., preferably about 450 degrees C., and held for a period of 15 to 120 minutes, preferably 30 minutes. The improvements of the present invention are also possible using a simplified selenization sequence that ramps directly from room temperature to the higher temperatures of 400 to 500 degrees C. without the pre-anneal at lower temperatures of 250 to 350 degrees C.

An additional advantage of the present invention is the wide variety of sources of selenium that are possible when a gallium-containing interlayer is present. The preferred embodiment involves annealing the Cu, In and Ga composite in a gas comprising twelve percent $H_2Se$ in nitrogen. CIS films lacking the gallium-containing interlayer often peel off of the metal substrate when annealed in high concentrations of $H_2Se$, but the gallium containing interlayers provide good adhesion of CIS to metal substrates over a wide range of $H_2Se$ concentrations. An alternative to $H_2Se$ as a source of selenium is a layer of selenium deposited onto the Cu, In and Ga composite. This Cu, In, Ga and Se composite is then annealed in a reactive or an inert gas to form the final film structure.

The improved adhesion achieved by the present invention was discovered during normal processing of experimental samples and modules made using the first preferred method, that is deposition of a copper/gallium alloy. To test samples, portions of the CIS are normally scraped from the metal substrate to allow electrical contact. Likewise, in making modules, scribe lines are normally cut through the CIS to allow contact to the metal substrate for series interconnection of cells. While the conventional scraping and scribing equipment was able to remove most of the CIS film from structures made according to the present invention, some type of film was observed remaining on the metal substrate. Repeated scraping or scribing operations were required to obtain a clean exposed area on the metal substrate. Test samples from which the CIS had been scraped were tested by Auger methods to determine the elemental composition of the unusual film. This test indicated the presence of a thin film containing gallium and selenium on the surface of the molybdenum layer. This film also contained copper and indium. Based on these tests we believe that the structure resulting from the preferred method of manufacture, i.e., sputtering a copper gallium alloy onto a molybdenum film, includes a film containing compounds of gallium and selenium at the interface between the metal substrate and the active CIS film. The gallium/selenium compounds adhere strongly to the molybdenum and to the CIS film, thereby preventing peeling, wrinkling and related problems.

The improved adhesion achieved by the present invention has a significant advantage in manufacture of solar modules which contain a large number of individual cells. The CIS film is typically separated into cells by mechanical scribing. If adhesion of CIS to the metal substrate is poor, significant losses occur due to shunts created by peeling of the CIS film at the edges of the scribe lines. Such peeling and shunting is prevented by use of the present invention.

Individual cells made according to the present invention exhibit an efficiency improvement of about fifteen to twenty percent as compared to control devices without a gallium interfacial film. This electrical performance improvement is due primarily to an increase in open circuit voltage, $V_{oc}$, of about ten percent, that is from about 0.42 to about 0.46 volt. This improved cell $V_{oc}$ in turn improves module performance and yield, since less cells are required to achieve a given module output voltage. The smaller number of cells reduces inactive area and reduces defects caused in the scribing process.

The adhesion improvements provided by an interfacial layer containing gallium are dramatically evident in devices comprising CIS on molybdenum substrates. We believe that similar adhesion improvements will also be evident using other I-III-VI compound semiconductor films, including multinary films containing more than three elements.

CIS solar cells using tungsten, gold, nickel and nickel phosphide substrates or back contacts have been fabricated by us and by others. We have made CIS type solar cells (without gallium) using tungsten substrates instead of the molybdenum substrates used in the preferred embodiment and we experienced the same peeling and wrinkling problems as occur with molybdenum. We believe that an interfacial film containing gallium or gallium/selenium compounds will also improve adhesion of CIS films to tungsten substrates and other substrates which may be useful such as tantalum.

In the preferred embodiment, the glass sheet 10 acts as the mechanical substrate while the metal film 12 acts as the electrical back contact of the functional photovoltaic device and can be considered to be the electrical substrate. If desired, a solid sheet of metal, such as molybdenum, tungsten or tantalum, may be used as both the mechanical and electrical substrate. The use of a gallium interfacial film according to the present invention should improve adhesion to such substrates.

While the present invention has been described in terms of specific structures and methods of fabrication, it is apparent that modifications may be made therein within the scope of the appended claims.

What we claim is:

1. In a photovoltaic device of the type having a metal back contact, a Group I-III-VI semiconductor film of a first conductivity type on said back contact and a semiconductor film of conductivity type opposite said first type on said Group I-III-VI film, the improvement comprising:

an interfacial film containing gallium between said metal back contact and said Group I-III-VI film.

2. An improved device according to claim 1 wherein said interfacial film comprises gallium and at least one of the elements which comprise said Group I-III-VI film.

3. An improved device according to claim 2 wherein said interfacial film comprises gallium selenide.

4. An improved device according to claim 1 wherein said interfacial film contains gallium equivalent to at least about fifty angstroms of pure elemental gallium.

5. In a photovoltaic device of the type having a metal back contact, a copper indium diselenide semiconductor film of a first conductivity type on said back contact and a semiconductor film of a second conductivity type on said copper indium diselenide film, the improvement comprising:

an interfacial film containing gallium between said back contact and said copper indium diselenide film.

6. The photovoltaic device of claim 5 wherein said back contact comprises molybdenum.

7. The photovoltaic device of claim 5 wherein said back contact comprises a film of molybdenum on a glass substrate.

8. The photovoltaic device of claim 5 wherein said interfacial film comprises copper, indium, selenium and at least one atomic percent gallium.

9. An improved device according to claim 5 wherein said interfacial film comprises gallium selenide.

10. An improved device according to claim 5 wherein said interfacial film contains gallium equivalent to at least about fifty angstroms of pure elemental gallium.

11. A photovoltaic device comprising:
a metal back contact;
an interfacial film comprising gallium on said back contact;
a film of p-type copper indium diselenide semiconductor on said interfacial film; and
a film of n-type semiconductor deposited on said copper indium diselenide film.

12. The photovoltaic device of claim 11 wherein said back contact comprises molybdenum.

13. The photovoltaic device of claim 11 wherein said back contact comprises a film of molybdenum on a glass substrate.

14. A device according to claim 11 wherein said interfacial film comprises copper, indium, selenium and at least one atomic percent gallium.

15. A device according to claim 11 wherein said interfacial layer is less than 2000 angstroms thick.

16. A device according to claim 15 wherein said interfacial layer is from about 50 to about 500 angstroms thick.

17. A device according to claim 11 wherein said interfacial film comprises gallium selenide.

18. A device according to claim 11 wherein said interfacial film contains gallium equivalent to at least about fifty angstroms of pure elemental gallium.

19. A method for making a photovoltaic device comprising:
depositing an interfacial film containing gallium on a metal back contact,
depositing a film of copper on said interfacial film,
depositing a film of indium on said film of copper,
heating said back contact and interfacial, copper and indium films in the presence of a source of selenium at a temperature and for a time selected to cause interdiffusion of copper, indium and selenium to form a film comprising copper indium diselenide.

20. A method according to claim 19 wherein said interfacial film comprises copper and at least about one atomic percent gallium.

21. A method according to claim 19 wherein said interfacial film comprises gallium selenide.

22. A method according to claim 19 wherein said interfacial film is deposited to a thickness selected to provide a quantity of gallium equivalent to about fifty angstroms of pure elemental gallium.

23. A method for making a photovoltaic device comprising:
depositing a first film comprising copper and at least one atomic percent gallium on a metal back contact,
depositing a second film comprising indium on said first film, and
heating said substrate with said first and second films in the presence of a source of selenium for a time and at a temperature selected to cause interdiffusion of copper, indium and selenium to form a film consisting essentially of copper indium diselenide.

24. A method according to claim 23 wherein said first film is deposited to a thickness selected to provide a quantity of gallium equivalent to at least about fifty angstroms of pure elemental gallium.

* * * * *

REEXAMINATION CERTIFICATE (1676th)
United States Patent [19]
Pollock et al.

[11] B1 4,915,745
[45] Certificate Issued Apr. 7, 1992

[54] THIN FILM SOLAR CELL AND METHOD OF MAKING

[76] Inventors: Gary A. Pollock, 22332 Hamlin St., Canoga Park, Calif. 91303; Kim W. Mitchell, 13238 Mission Tierra, Granada Hills, Calif. 91344; James H. Ermer, 918 E. Tujunga, Burbank, Calif. 91501

Reexamination Request:
No. 90/002,420, Aug. 28, 1991

Reexamination Certificate for:
Patent No.: 4,915,745
Issued: Apr. 10, 1990
Appl. No.: 247,802
Filed: Sep. 22, 1988

[51] Int. Cl.$^5$ .................... H01L 31/06; H01L 31/18
[52] U.S. Cl. .................... 136/265; 136/260; 136/264; 437/5; 427/76; 357/30
[58] Field of Search ............ 136/256, 260, 264, 265; 357/30 E, 30 J; 437/5, 232; 427/74, 76

[56] References Cited
U.S. PATENT DOCUMENTS

| | | | |
|---|---|---|---|
| 4,335,266 | 6/1982 | Mickelsen et al. | 136/260 |
| 4,465,575 | 8/1984 | Love et al. | 204/192.26 |
| 4,581,108 | 4/1986 | Kapur et al. | 204/37.1 |
| 4,611,091 | 9/1986 | Choudary et al. | 136/260 |
| 4,703,131 | 10/1987 | Dursch | 136/258 PC |
| 4,798,660 | 1/1989 | Ermer et al. | 204/192.17 |
| 4,818,357 | 4/1989 | Case et al. | 204/192.25 |

OTHER PUBLICATIONS

L. L. Kazmerski et al., *J. Vac. Sci. Technol. A2*, vol. 27, Apr./Jun. 1984, pp. 292–295.
N. Romeo et al., *Conf. Record, 18th IEEE Photovoltaic Specialists Conference* (1985), pp. 1388–1392.
V. J. Kapur et al., *Conf. Records, 18th IEEE Photovoltaic Specialists Conference* (1985), pp. 1429–1432.
V. J. Kapur et al., *Solar Cells*, vol. 21, pp. 65–72 (1987).
SERI Final Report, Contract No. XI-5-05036-1, Oct., 1987.
Kwietniak, M. et al., "Thin Film Heterojunction CdS/Cu Ternary Alloys Solar Cells with Minority Carrier Mirrors", *Proceedings, 4th European Community Photovoltaic Solar Energy Conference*, Stresa, Italy, May 10–14, 1982 (Reidel Publishing Co., 1982).

*Primary Examiner*—Aaron Weisstuch

[57] ABSTRACT

A structure for, and method of making, thin films of Group I-III-VI compound semiconductors such as copper indium diselenide for use in heterojunction photovoltaic devices fabricated on metal substrates. An interfacial film containing gallium is first deposited upon the substrate. Thereafter, copper and indium films are deposited and the resulting stacked film is heated in the presence of a source of selenium to form copper indium diselenide semiconductor material with improved adhesion to the substrate and improved performance.

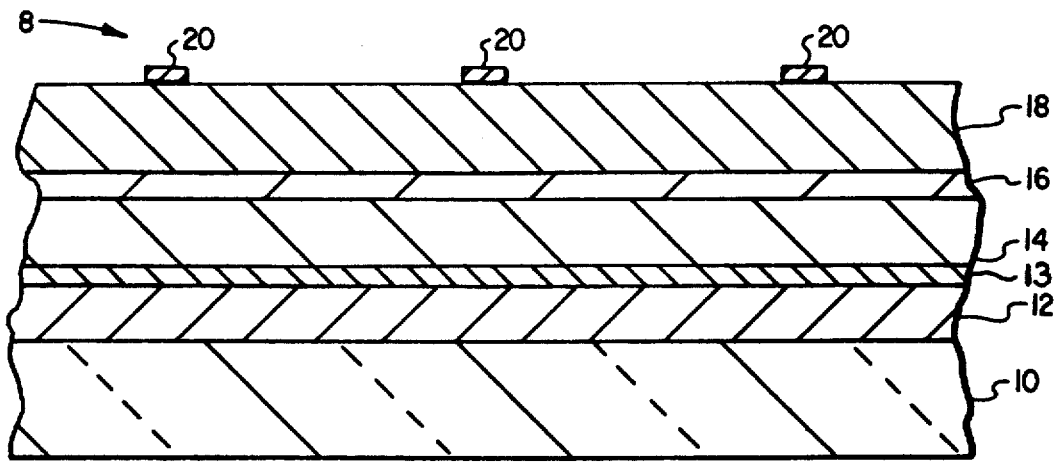

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 3, lines 14–48:

With reference to FIG. 1, there is illustrated a portion of a photovoltaic cell 8 corresponding generally to that described in the above referenced U.S. Pat. No. 4,611,091. This is the preferred structure of the present invention and is the structure used in the example devices described below. Cell 8 is structurally supported on a glass substrate 10 which is about one to four millimeters thick. A back electrical contact comprises a metal layer 12 deposited on substrate 10. Layer 12 in a preferred embodiment is molybdenum having a thickness of about 0.2 to two microns. In the preferred embodiments film 12 includes a very thin film, 100 to 500 angstroms, of chromium first deposited on glass substrate 10 to improve adhesion of the molybdenum to the glass. Deposited upon layer 12 is an interfacial film or layer 13 containing gallium. The structures of and methods of making layer 13 are described in more detail below. The first active region of the device 8 comprises a semiconducting film 14, which in a preferred embodiment is p-type CIS having a thickness of about one to three microns. The manufacture of layer 14 is also described in more detail below. A thin layer 16 of n-type semiconductor material comprising cadmium sulfide is positioned on layer 14. In the preferred embodiments, layer 16 has a thickness of from about 250 to 500 angstroms. A layer [8] *18* of conducting wide bandgap n-type semiconductor material is positioned on layer 16. In the preferred embodiment, layer 18 is formed primarily of zinc oxide and has a thickness of from about 1.5 to 3.5 microns. The device 8 is completed by a series of front face contacts 20 in the form of narrow metal strips which may be, for example, aluminum deposited by sputtering, evaporating or plating. In some device designs, contacts 20 are omitted.

Column 5, lines 58–68:

A number of devices were fabricated according to FIG. 2 in which the copper/gallium (17 atomic percent gallium), film 13 had thicknesses less than the 2500 angstroms described immediately above. A film of pure copper was then deposited to a thickness selected to provide the baseline amount of copper, that is 12.7 mg copper per 100 cm² substrate area. The CIS films [ere] *were* completed by deposition of indium and selenization as described above. Devices were completed according to FIG. 1 to test efficiencies. Devices were made using copper/gallium alloy film thicknesses of 10%, 50% and

AS A RESULT OF REEXAMINATION, IT HAS BEEN DETERMINED THAT:

The patentability of claims 18–24 is confirmed.

Claims 1, 3, 5–9, 11–15, 17 are determined to be patentable as amended.

Claims 2, 4, 10, 16, dependent on an amended claim, are determined to be patentable.

New claims 25–31 are added and determined to be patentable.

1. In a photovoltaic device of the type having a [metal] back contact *comprising a metal selected from the group consisting of molybdenum, tungsten, and tantalum*, a Group I-III-VI semiconductor film of a first conductivity type on said back contact and a semiconductor film of conductivity type opposite said first type on said Group I-III-VI film, the improvement comprising:

an interfacial film containing gallium between said [metal] back contact and said Group I-III-VI film.

3. [An improved device according to claim 2 wherein] *In a photovoltaic device of the type having a metal back contact, a Group I-III-IV semiconductor film of a first conductivity type on said back contact and a semiconductor film of conductivity type opposite said first type on said Group I-III-VI film, the improvement comprising:*

*an interfacial film containing gallium between said metal back contact and said Group I-III-VI film;* said interfacial film 1 [comprises] *comprising* gallium selenide.

5. In a photovoltaic device of the type having a [metal] back contact *comprising a metal selected from the group consisting of molybdenum, tungsten, and tantalum*, a copper indium diselenide semiconductor film of a first conductivity type on said back contact and a semiconductor film of a second conductivity type on said copper indium diselenide film, the improvement comprising:

an interfacial film containing gallium between said back contact and said copper indium diselenide film.

6. [The photovoltaic device of claim 5 wherein] *In a photovoltaic device of the type having a metal back contact, a copper indium diselenide semiconductor film of a first conductivity type on said back contact and a semiconductor film of a second conductivity type on said copper indium diselenide film, the improvement comprising:*

*an interfacial film containing gallium between said back contact and said copper indium diselenide film;* said back contact [comprises] *comprising* molybdenum.

7. [The photovoltaic device of claim 5 wherein] *In a photovoltaic device of the type having a metal back contact, a copper indium diselenide semiconductor film of a first conductivity type on said back contact and a semiconductor film of a second conductivity type on said copper indium diselenide film, the improvement comprising:*

*an interfacial film containing gallium between saidback contact and said copper indium diselenide film;* said back contact [comprises] *comprising* a film of molybdenum on a glass substrate.

8. [The photovoltaic device of claim 5 wherein] *In a photovoltaic device of the type having a metal back contact, a copper indium diselenide semiconductor film of* a first conductivity type on said back contact and a semiconductor film of a second conductivity type on said copper indium diselenide film, the improvement comprising:

an interfacial film containing gallium between said back contact and said copper indium diselenide film;

said interfacial film [comprises] *comprising* copper, indium, selenium and at least one atomic percent gallium.

9. [The photovoltaic device of claim 5 wherein] *In a photovoltaic device of the type having a metal back contact, a copper indium diselenide semiconductor film of a first conductivity type on said back contact and a semiconductor film of a second conductivity type on said copper indium diselenide film, the improvement comprising:* an interfacial film containing gallium between said back contact and said copper indium diselenide film;

said interfacial film [comprises] *comprising* gallium selenide.

11. A photovoltaic device comprising:

a [metal] back contact *comprising a metal selected from the group consisting of molybdenum, tungsten, and tantalum;* an interfacial film comprising gallium on said back contact;

a film of p-type copper indium diselenide semiconductor on said interfacial film; and a film of n-type semiconductor deposited on said copper indium diselenide film.

12. [The photovoltaic device of claim 11 wherein] *A photovoltaic device comprising:*

*a metal back contact;*

*an interfacial film comprising gallium on said back contact;*

*a film of p-type copper indium diselenide semiconductor on said interfacial film; and*

*a film of n-type semiconductor deposited on said copper indium diselenide film;* said back contact [comprises] *comprising* molybdenum.

13. [The photovoltaic device of claim 11 wherein] *A photovoltaic device comprising:*

*a metal back contact;*

*an interfacial film comprising gallium on said back contact;*

*a film of p-type copper indium diselenide semiconductor on said interfacial film; and*

*a film of n-type semiconductor deposited on said copper indium diselenide film;* said back contact [comprises] *comprising* a film of molybdenum on a glass substrate.

14. [A device according to claim 11 wherein] *A photovoltaic device comprising:*

*a metal back contact;*

*an interfacial film comprising gallium on said back contact;*

*a film of p-type copper indium diselenide semiconductor on said interfacial film; and*

*a film of n-type semiconductor deposited on said copper indium diselenide film;* said interfacial film [comprises] *comprising* copper, indium, selenium and at least one atomic percent gallium.

15. [A device according to claim 11 wherein] *A photovoltaic device comprising:*

*a metal back contact;*

*an interfacial film comprising gallium on said back contact;*

*a film of p-type copper indium diselenide semiconductor on said interfacial film; and*

*a film of n-type semiconductor deposited on said copper indium diselenide film;* said interfacial layer [is] *being* less than 2000 angstroms thick.

17. [A device according to claim 11 wherein] *A photovoltaic device comprising:*

*a metal back contact;*

*an interfacial film comprising gallium on said back contact;*

*a film of p-type copper indium diselenide semiconductor on said interfacial film; and*

*a film of n-type semiconductor deposited on said copper indium diselenide film;* said interfacial film [comprises] *comprising* gallium selenide.

25. *In a photovoltaic device of the type having a metal back contact, a Group I-III-VI semiconductor film of a first conductivity type on said back contact and a semiconductor film of conductivity type opposite said first type on said Group I-III-IV film, the improvement comprising:*

*an interfacial film containing gallium between said metal back contact and said Group I-III-VI film;*

*said interfacial film comprising a group I element, a Group III element other than gallium, a Group IV element, and at least one atomic percent gallium.*

26. *An improved device according to claim 25 wherein said Group I element is copper.*

27. *An improved device according to claim 25 wherein said Group III element other than gallium is indium.*

28. *An improved device according to claim 25 wherein said Group VI element is selenium.*

29. *In a photovoltaic device of the type having a metal back contact, a Group I-III-VI semiconductor film of a first conductivity type on said back contact and a semiconductor film of conductivity type opposite said first type on said Group I-III-VI film, the improvement comprising:*

*an interfacial film containing gallium between said metal back contact and said Group I-III-VI film;*

*said interfacial film consisting essentially of a Group I element, a Group VI element and at least one atomic percent gallium.*

30. *An improved device according to claim 29 wherein said Group I element is copper.*

31. *An improved device according to claim 32 wherein said Group VI element is selenium.*

* * * * *